(12) United States Patent
Shimomura et al.

(10) Patent No.: US 8,384,285 B2
(45) Date of Patent: *Feb. 26, 2013

(54) PHOSPHOR, LIGHT-EMITTING DEVICE USING SAME, IMAGE DISPLAY AND ILLUMINATING DEVICE

(75) Inventors: Yasuo Shimomura, Yokohama (JP); Naoto Kijima, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 14 days.

This patent is subject to a terminal disclaimer.

(21) Appl. No.: 13/102,416

(22) Filed: May 6, 2011

(65) Prior Publication Data

US 2012/0007115 A1    Jan. 12, 2012

Related U.S. Application Data

(62) Division of application No. 11/631,390, filed as application No. PCT/JP2005/012100 on Jun. 30, 2005, now abandoned.

(30) Foreign Application Priority Data

Jun. 30, 2004  (JP) .................................. 2004-194508

(51) Int. Cl.
| | |
|---|---|
| C09K 11/02 | (2006.01) |
| C09K 11/08 | (2006.01) |
| C09K 11/77 | (2006.01) |
| H01J 1/52 | (2006.01) |
| H01J 19/40 | (2006.01) |

(52) U.S. Cl. ................. 313/503; 252/301.4 R
(58) Field of Classification Search ........... 252/301.4 R; 313/503
See application file for complete search history.

(56) References Cited

U.S. PATENT DOCUMENTS

| | | | |
|---|---|---|---|
| 5,611,959 A | 3/1997 | Kijima et al. | |
| 5,998,925 A | 12/1999 | Shimizu et al. | |
| 6,010,644 A * | 1/2000 | Fu et al. ................. | 252/301.4 R |
| 6,123,871 A | 9/2000 | Carroll | |
| 6,712,993 B2 | 3/2004 | Kijima et al. | |
| 7,189,340 B2 | 3/2007 | Shimomura et al. | |
| 7,790,058 B2 | 9/2010 | Shimomura et al. | |
| 8,021,576 B2 * | 9/2011 | Shimizu et al. ......... | 252/301.4 R |
| 2003/0038295 A1 | 2/2003 | Koda | |
| 2004/0135122 A1 * | 7/2004 | Hyland et al. ......... | 252/301.4 R |
| 2004/0144956 A1 | 7/2004 | Kijima et al. | |
| 2004/0218115 A1 | 11/2004 | Kawana et al. | |
| 2004/0251809 A1 | 12/2004 | Shimomura et al. | |
| 2005/0145854 A1 | 7/2005 | Seto et al. | |
| 2007/0085466 A1 | 4/2007 | Shimomura et al. | |
| 2007/0222360 A1 | 9/2007 | Kandea et al. | |
| 2009/0243467 A1 | 10/2009 | Shimizu et al. | |
| 2010/0283383 A1 | 11/2010 | Shimomura et al. | |

FOREIGN PATENT DOCUMENTS

| | | |
|---|---|---|
| CH | 1095748 | 11/1994 |
| EP | 0 622 440 | 11/1994 |
| EP | 1 783 839 A1 | 5/2007 |
| JP | 6-100860 | 4/1994 |
| JP | 10-140421 | 5/1998 |
| JP | 10-242513 | 9/1998 |
| JP | 2001-226671 | 8/2001 |
| JP | 2002-363554 | 12/2002 |
| JP | 2003-41250 | 2/2003 |
| JP | 2003-64358 | 3/2003 |
| JP | 2003-89517 | 3/2003 |
| JP | 2003-142737 | 5/2003 |
| JP | 2004-27143 | 1/2004 |
| JP | 2004-111937 | 4/2004 |
| JP | 2006-19409 | 1/2006 |
| JP | 2006-19419 | 1/2006 |
| JP | 2006-45526 | 2/2006 |

OTHER PUBLICATIONS

European Office Action issued Jan. 11, 2011, in Patent Application No. 05 765 311.5.
V. Manivannan, et al., "$Ce^{3+}$ luminescence in $ML_2O_4$ system (M=Sr, Ca) and (Ln=Gd, Lu, Sc)", Journal of Luminescence, 2002, pages 1-4 (with English Abstract).
Office Action issued Dec. 30, 2010 in Korean Application No. 2006-7027885.
Jia, Journal of Luminescence 2003, vol. 101, pp. 115-121.
Manivannan, V. et al., "Nature of luminescent centers in Cerium-activated materials with the CaFe2O4 structure", Journal of Luminescence, vol. 102-103, pp. 635-637, 2003.
Proceedings of the papers in 264th Phosphor Research Society, Nov. 29, 1996 (Friday), w/English translation.
Huh et al, Journal of the Electrochemical Society, (2003), vol. 150, No. 2,, pp. H57-H60.
Blasse et al, Journal of Chemical Physics, (1967), vol. 47, No. 12 pp. 5139-5145.

(Continued)

Primary Examiner — Carol M Koslow
Assistant Examiner — Matthew E Hoban
(74) Attorney, Agent, or Firm — Oblon, Spivak, McClelland, Maier & Neustadt, L.L.P.

(57) ABSTRACT

The present invention relates to a phosphor represented by the following general formula (I), comprising: a composite oxide containing a divalent and trivalent metal elements as a host crystal; and at least Ce as an activator element in said host crystal, wherein the phosphor has a maximum emission peak in a wavelength range of from 485 nm to 555 nm in the emission spectrum at room temperature:

$$M^1_a M^2_b M^3_c O_d \quad (I)$$

wherein $M^1$ represents an activator element containing at least Ce; $M^2$ represents a divalent metal element; $M^3$ represents a trivalent metal element; a is a number within a range of $0.0001 \leq a \leq 0.2$; b is a number within a range of $0.8 \leq b \leq 1.2$; c is a number within a range of $1.6 \leq c \leq 2.4$; and d is a number within a range of $3.2 \leq d \leq 4.8$. Further, a light emitting device comprising said phosphor and a display and a lighting system having said light emitting device as a light source are disclosed. In accordance with the present invention, a phosphor which can be easily produced and can provide a light emitting device having a high color rendering, a light emitting device comprising the phosphor, and a display and a lighting system comprising the light emitting device as a light source can be provided.

18 Claims, 2 Drawing Sheets

OTHER PUBLICATIONS

Yuta et al, J. Electrochem. Soc., (1992), vol. 139, No. 8, pp. 2347-2352.

Optical Physics, written Takashi Kushida, published Nov. 25, 1994, pp. 160-161 (w/partial English translation).

Sony Research Reports Supplement, "Luminescence of Rare-Earth Ion", written by Teruhiko Hoshina, published Nov. 25, 1983, p. 84 (w/partial English translation).

* cited by examiner

PHOSPHOR, LIGHT-EMITTING DEVICE USING SAME, IMAGE DISPLAY AND ILLUMINATING DEVICE

TECHNICAL FIELD

In recent years, a white light-emitting device comprising in combination a gallium nitride (GaN)-based light emitting diode (LED) as a semiconductor light emitting device and a phosphor as a wavelength conversion material has been noted as a light source for display or lighting system by making the use of its characteristics of small power consumption and prolonged life.

The present invention concerns a cerium (Ce)-activated oxide phosphor which can emit light in the range of from red to blue when excited with electron ray, X-ray, ultraviolet ray, visible light or the like. In particular, the present invention concerns a phosphor which can absorb light in the range of from near ultraviolet to bluish green through blue to efficiently emit light in a longer wavelength range such as from green to red through yellow, which phosphor can be used as a wavelength conversion material for absorbing light from a semiconductor light emitting device such as light-emitting diode (LED) and laser diode (LD) which emits light in the range of from near ultraviolet to blue to constitute a light emitting device having a high color rendering, particularly a white light-emitting device (hereinafter referred to as "white LED"). Further, the present invention concerns a light emitting device and an electroluminescence light emitting device comprising the phosphor and a display and a lighting system having such a light emitting device as a light source.

BACKGROUND ART

As disclosed in Patent Reference 1, a white light-emitting device comprising in combination a GaN-based blue light-emitting diode and a phosphor has been noted as a light source for display or lighting system by making the use of its characteristics of small power consumption and prolonged life. Referring to this light emitting device, the phosphor incorporated therein absorbs visible light in the blue range emitted by the GaN-based blue light-emitting diode to emit yellow light, and the blue light from the diode which has not been absorbed by the phosphor and the yellow light emitted by the phosphor are then mixed with each other to attain emission of white light.

As the phosphor there has been typically known a phosphor comprising a yttrium-aluminum composite oxide ($Y_3Al_5O_{12}$) as a host crystal and cerium (Ce) incorporated as an activator element in said host crystal. Further, it has been known that the tone of light emitted by this phosphor can be adjusted by replacing some of yttrium (Y) atoms by gadolinium (Gd) or the like or replacing some of aluminum (Al) atoms by gallium (Ga) or the like (Non-patent Reference 1). However, there were problems that in order to produce efficiently this phosphor as a single phase, the material must be calcined at extremely high temperature that makes it difficult to produce the phosphor, and a phosphor which is uniform in emission intensity, chromaticity, particle diameter, etc. can be difficultly produced.

Also, a light emitting device comprising a blue light-emitting diode and a yellow light-emitting phosphor in combination was disadvantageous in that the emission of light in the range of from bluish green to green is short, giving deteriorated color rendering. In order to improve color rendering, a method has been proposed which comprises combining a blue light-emitting diode with a green phosphor and a red phosphor, and Non-patent Reference 2, for example, discloses a white LED comprising in combination a blue light-emitting diode, a green phosphor $SrGa_2S_4:Eu^{2+}$ and a red phosphor ZnCdS:Ag, Cl. However, the phosphor used was disadvantageous in that it is a sulfide, can be difficultly produced and lacks stability in use.

On the other hand, as a phosphor which is produced at a relatively low calcining temperature and thus can be relatively easily produced there is disclosed a Ce-activated calcium-scandium-silicon composite oxide ($Ca_3Sc_2Si_3O_{12}$) in Patent Reference 2. This phosphor contains calcium oxides and silicon oxides that form a low-melting compound when calcined, and a calcined powder is extremely firmly sintered although the calcining temperature can be lowered. Further, this phosphor had a high emission intensity, and it was difficult to obtain a phosphor having particle diameters which are as uniform as about 1 μm to 20 μm.

On the other hand, a phosphor comprising thulium (Tm) incorporated in a scandate of alkaline earth metal having the same $CaFe_2O_4$ structure as that of the desired phosphor of the present invention is disclosed in Patent Reference 3. However, this phosphor shows emission of light having a narrow half width based on 4f-4f transition when excited with electron ray and is quite different in mechanism from that of cerium-derived emission from the phosphor of the present invention, i.e., emission of light having a wide half width based on 4f-5d transition. Further, this thulium-containing phosphor is a material which does not emit light when irradiated with ultraviolet ray or visible light, and it is thus not easy to anticipate and produce the phosphor of the present invention from the presence of this phosphor.

Moreover, phosphors comprising cerium incorporated in a strontium yttrate ($SrY_2O_4$), which, too, each are a crystal having $CaFe_2O_4$ structure, are disclosed in Non-patent Reference 3 and Non-patent Reference 4, but these phosphors do not show emission efficiently at room temperature. Further, a phosphor comprising cerium incorporated in a strontium thioyttrate ($SrY_2S_4$), which, too, is a crystal having $CaFe_2O_4$ structure, is disclosed in Non-patent Reference 5, but this phosphor was a sulfide and thus was practically disadvantageous in long-range stability, producibility, etc.

Patent Reference 1: JP-A-10-242513
Patent Reference 2: JP-A-2003-064358
Patent Reference 3: JP-A-6-100860
Non-patent Reference 1: Preprints of 264th Meeting, Phosphor Research Society, pp. 5-14
Non-patent Reference 2: Journal of The Electrochemical Society, Vol. 150 (2003), pp. H57-H60
Non-patent Reference 3: The Journal of Chemical Physics, vol. 47, pp. 5139-5145 (1967)
Non-patent Reference 4: Journal of Luminescence, Vol. 102-103, pp. 635-637 (2003)
Non-patent Reference 5: Journal of The Electrochemical Society, Vol. 139, pp. 2347-2352 (1992)

DISCLOSURE OF THE INVENTION

Problems to be Solved by the Invention

The present invention has been worked out to develop a phosphor which can be easily produced and has a high emission intensity and a uniform particle diameter and even a phosphor which can provide a light emitting device having a high color rendering in the light of the aforementioned related art techniques and is intended to provide a phosphor which can be easily produced and gives high color rendering, a light emitting device and an electroluminescence device comprising the phosphor, and a display and a lighting system comprising the light emitting device as a light source.

Means for Solving the Problems

As a result of extensive studies of solution to the aforementioned problems, the present inventors found that a phosphor comprising a compound having a specific chemical composition as a host crystal, containing at least trivalent cerium ($Ce^{3+}$) in said host crystal as an activator element and having a maximum emission peak in a wavelength range of from 485 nm to 555 nm in the emission spectrum can accomplish the aforementioned object. The present invention has been thus worked out and has the followings as essence.

(1) A phosphor represented by the following general formula (I), which comprises: a composite oxide containing divalent and trivalent metal elements, as a host crystal; and at least Ce as an activator element in said host crystal, wherein the phosphor has a maximum emission peak in a wavelength range of from 485 nm to 555 nm in the emission spectrum at room temperature:

$$M^1{}_a M^2{}_b M^3{}_c O_d \qquad (I)$$

wherein $M^1$ represents an activator element containing at least Ce; $M^2$ represents a divalent metal element; $M^3$ represents a trivalent metal element; a is a number within a range of $0.0001 \leq a \leq 0.2$; b is a number within a range of $0.8 \leq b \leq 1.2$; c is a number within a range of $1.6 \leq c \leq 2.4$; and d is a number within a range of $3.2 \leq d \leq 4.8$.

(2) The phosphor as described in (1), wherein the activator element $M^1$ in the general formula (I) contains at least Ce and at least one element selected from the group consisting of Cr, Mn, Fe, Co, Ni, Cu, Pr, Nd, Sm, Eu, Tb, Dy, Ho, Er, Tm and Yb.

(3) The phosphor as described in (1) or (2), wherein the divalent metal element $M^2$ in the general formula (I) is at least one metal element selected from the group consisting of Mg, Ca, Zn, Sr, Cd and Ba.

(4) The phosphor as described in any one of (1) to (3), wherein the trivalent metal element $M^3$ in the general formula (I) is at least one metal element selected from the group consisting of Al, Sc, Ga, Y, In, La, Gd and Lu.

(5) The phosphor as described in any one of (1) to (4), which comprises at least Sc as trivalent metal element $M^3$ in the general formula (I).

(6) The phosphor as described in (5), wherein 50 mol % or more of the trivalent metal elements $M^3$ is Sc.

(7) The phosphor as described in any one of (1) to (6), wherein the host crystal of the phosphor is a crystal represented by the composition formula $M^2 M^3{}_2 O_4$ (in which $M^2$ represents a divalent metal element and $M^3$ represents a trivalent metal element).

(8) The phosphor as described in any one of (1) to (7), wherein the host crystal of the phosphor has any of space groups Pnma, Fd3(-)m, $P2_1/n$, $P2_1$, $P6_3$ or $P2_1/c$.

(9) The phosphor as described in any one of (1) to (8), which has a maximum emission peak in a wavelength range of from 500 nm to 535 nm in the emission spectrum at room temperature.

(10) A light emitting device comprising: a phosphor which is a wavelength conversion material; and a semiconductor light emitting device which emits light in a wavelength range of from ultraviolet to visible light, wherein said light emitting device contains at least a phosphor described in any one of (1) to (9) as said phosphor.

(11) An electroluminescence light emitting device comprising a phosphor described in any one of (1) to (9).

(12) A display comprising a light emitting device described in (10) or (11) as a light source.

(13) A lighting system comprising a light emitting device described in (10) or (11) as a light source.

Advantage of the Invention

In accordance with the present invention, a phosphor which can be easily produced and can provide a light emitting device having a high color rendering, a light emitting device comprising said phosphor, and a display and a lighting system comprising said light emitting device as a light source can be provided.

BRIEF DESCRIPTION OF THE DRAWINGS

FIG. 1 also depicts the standard diffraction pattern of $CaSc_2O_4$ set forth in No. 72-1360 of JCPDS card. It is shown that the diffraction pattern of the phosphor obtained in Example 1 coincides well with said standard diffraction pattern.

DESCRIPTION OF REFERENCE NUMERALS AND SIGNS

Figure 1:
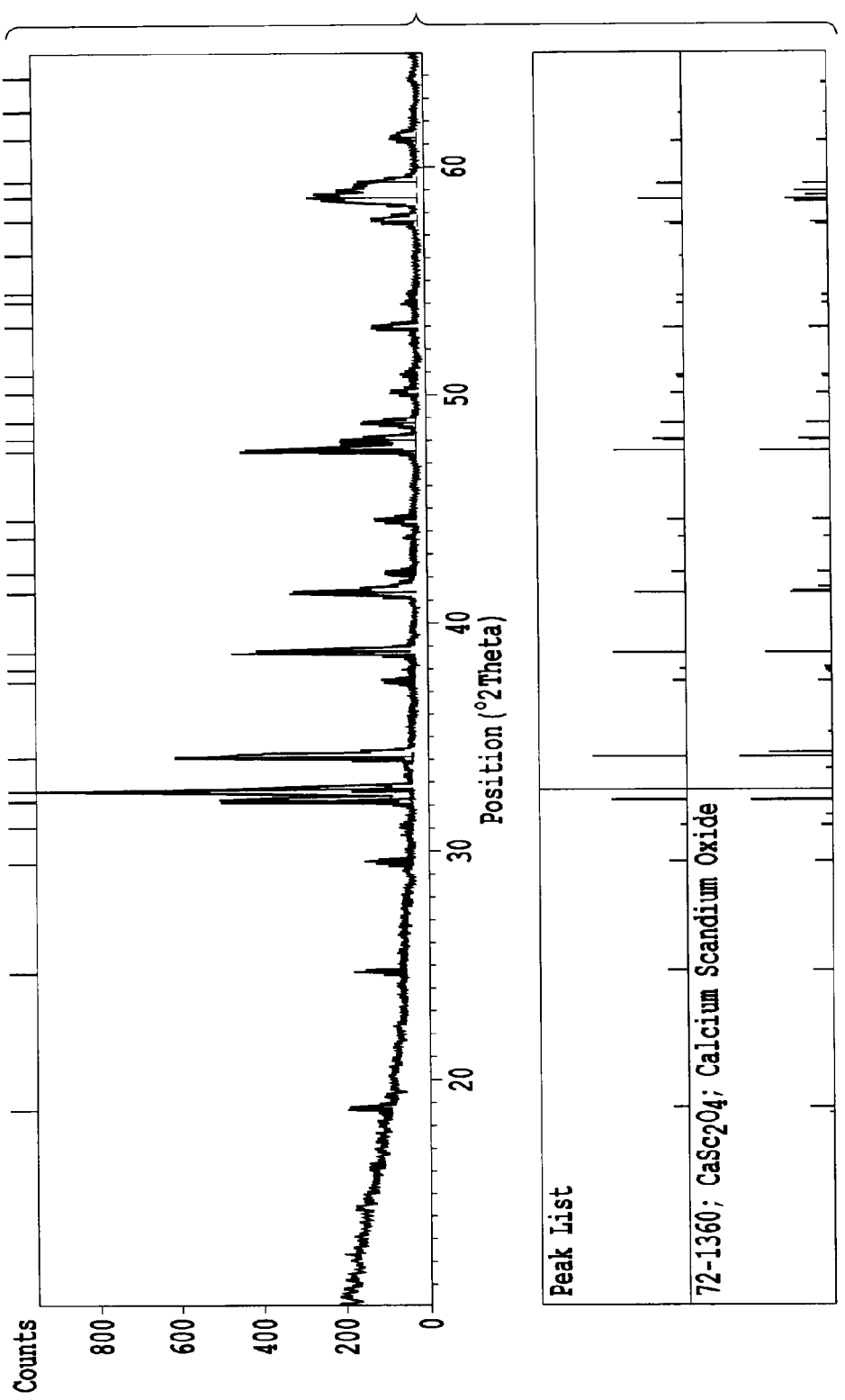
FIG. 1 is the powder X-ray diffraction pattern (X-ray source=CuKα) of a phosphor obtained in Example 1 of the present invention.

1: Light emitting device
2: Mount lead
3: Inner lead
4: Semiconductor light emitting device
5: Phosphor-containing resin portion
6: Electrically-conductive wire
7: Molding member
8: Planar light emitting lighting system
9: Diffusion panel
10: Retaining case

BEST MODE FOR CARRYING OUT THE INVENTION

The phosphor of the present invention is a phosphor represented by the following general formula (I), which comprises: a composite oxide containing a divalent and trivalent metal elements as a host crystal; and at least Ce as an activator element in said host crystal, the phosphor having a maximum emission peak in a wavelength range of from 485 nm to 555 nm in the emission spectrum at room temperature:

$$M^1{}_a M^2{}_b M^3{}_c O_d \qquad (I)$$

(wherein $M^1$ represents an activator element containing at least Ce; $M^2$ represents a divalent metal element; $M^3$ represents a trivalent metal element; a is a number within a range of $0.0001 \leq a \leq 0.2$; b is a number within a range of $0.8 \leq b \leq 1.2$; c is a number within a range of $1.6 \leq c \leq 2.4$; and d is a number within a range of $3.2 \leq d \leq 4.8$).

Herein, $M^1$ in the general formula (I) is an activator element (luminescent center ion) contained in the host crystal described later which contains at least Ce and may contain at least one divalent to tetravalent element selected from the group consisting of Cr, Mn, Fe, Co, Ni, Cu, Ce, Pr, Nd, Sm, Eu, Tb, Dy, Ho, Er, Tm and Yb as a coactivator for the purpose of phosphorescence, chromaticity adjustment, sensitization, etc. In the case where a coactivator is incorporated, the amount of the coactivator based on 1 mol of Ce is normally from 0.01 mol to 20 mol. In particular, when Pr is used as a coactivator, the emission of light from Pr appears in the vicinity of 620 nm in addition to the emission of light from Ce, making it possible to add the emission of light of red component to advantage.

The concentration a of the activator element $M^1$ is within a range of $0.0001 \leq a \leq 0.2$. When the value of a is too small, the amount of the luminescent center ion present in the host crystal of phosphor is too small, giving a tendency that the emission intensity decreases. On the other hand, when the value of a is too large, a tendency is given that concentration quenching causes the decrease of emission intensity.

Accordingly, a is preferably number within a range of $0.0005 \leq a \leq 0.1$, most preferably within a range of $0.002 \leq a \leq 0.04$ from the standpoint of emission intensity. Further, since as the concentration of Ce rises, the emission peak wavelength shifts toward longer range to show a relative increase of the amount of emission of green light, with which a high visual sensitivity is given, a is preferably within a range of $0.004 \leq a \leq 0.15$, more preferably within a range of $0.008 \leq a \leq 0.1$, most preferably within a range of $0.02 \leq a \leq 0.08$ from the standpoint of balance between emission intensity and emission peak wavelength.

$M^2$ in the general formula (I) is a divalent metal element and is preferably at least one metal element selected from the group consisting of Mg, Ca, Zn, Sr, Cd and Ba from the standpoint of emission efficiency and more preferably contains at least one metal element of Mg, Ca and Sr. Herein, the green phosphor preferably contains much Ca as $M^2$, and it is most desirable that 50 mol % or more of $M^2$ elements is Ca. Further, the bluish green phosphor preferably contains much Sr as $M^2$, and it is most desirable that 50 mol % or more of $M^2$ elements is Sr.

$M^3$ in the general formula (I) is a trivalent metal element and is preferably at least one metal element selected from the group consisting of Al, Sc, Ga, Y, In, La, Gd, Yb and Lu for the same reason as for $M^2$, more preferably Al, Sc, Y, Yb or Lu. It is particularly desirable that at least Sc is contained as $M^3$ element, and for example, $M^3$ element is preferably Sc singly, or in combination with Y, Al or Lu, more preferably Sc singly, or in combination with Y. Further, it is particularly desirable that 50 mol % or more, preferably 60 mol % or more, more preferably 70 mol % or more of $M^3$ elements is Sc. When Sc is contained as $M^3$ element, the emission intensity is further enhanced to advantage.

The host crystal of the phosphor of the present invention is normally a crystal represented by the composition formula $M^2M^3_2O_4$ composed of $M^2$ as divalent metal element, $M^3$ as trivalent metal element and oxygen and the chemical composition ratio of b, c and d in the general formula (I) are thus normally 1, 2 and 4, respectively, but in the present, it may be not likely that b, c and d in the general formula (I) can be 1, 2 and 4, respectively, depending on which Ce, which is an activator element, substitutes on metal element $M^2$ or $M^3$ in the position of crystal lattice or in the interstitial.

Accordingly, in the present invention, b is a number within a range of $0.8 \leq b \leq 1.2$, c is a number of within a range of $1.6 \leq c \leq 2.4$, and d is a number of within a range of $3.2 \leq d \leq 4.8$. In particular, b and c are preferably a number within a range of $0.9 \leq b \leq 1.1$ and a range of $1.8 \leq c \leq 2.2$, respectively, and d is a number within a range of $3.6 \leq d \leq 4.4$. Further, a, b, c and d are numbers determined respectively, such that the charge balance of the phosphor of the present invention becomes neutral.

Further, $M^2$ and $M^3$ represent a divalent metal element and a trivalent metal element, respectively, but $M^2$ and/or $M^3$ can be extremely partly a metal element having a valence of 1, 4 or 5 to adjust the charge balance and may contain a slight amount of anion such as halogen element (F, Cl, Br, I), nitrogen, sulfur and selenium.

The host crystal of the phosphor of the present invention is a crystal represented by the composition formula $M^2M^3_2O_4$ comprised of $M^2$ as divalent metal element, $M^3$ as trivalent metal element and oxygen as previously mentioned. In general, a crystal of the composition ratio represented by this formula has any one of space groups:

$$Pnma, Fd3(-)m, P2_1/n, P2_1, P6_3, P2_1/c$$

depending on the difference of constituent metal elements. By employing a structure having the space group Pnma among these space groups, i.e., $CaFe_2O_4$ structure, a phosphor showing a high brightness green emission can be obtained to advantage.

Further, the phosphor of the present invention is a phosphor having a maximum emission peak in a wavelength range of from 485 nm to 555 nm in the emission spectrum at room temperature. The room temperature in the present invention is 25° C. In the case where there is a maximum emission peak wavelength in a wavelength range shorter than 485 nm, when this phosphor is excited by a blue LED having a wavelength of from 420 nm to 485 nm, the emission wavelength of the phosphor overlaps that of the blue LED, making it difficult to obtain good color rendering. Further, when the maximum emission peak exceeds 555 nm, emission components ranging from bluish green to green are insufficient, making it difficult to obtain good color rendering. Accordingly, it is preferred that there is a maximum emission peak in a wavelength range of from 485 nm to 545 nm, particularly preferably from 500 nm to 535 nm.

Further, even when some of oxygen atoms in the host crystal are substituted by sulfur to an extent such that the properties of the present invention are not impaired, a phosphor adapted for the object of the present invention can be obtained, but the substitution by a large amount of sulfur causes the deterioration of the phosphor to disadvantage.

The aforementioned phosphor of the present invention can be synthesized by an ordinary solid state reaction method. For example, the phosphor of the present invention can be produced by preparing a ground mixture by a dry method which comprises grinding raw materials such as activator element $M^1$ source compound, divalent metal element $M^2$ source compound and trivalent metal element $M^3$ source compound in the aforementioned general formula (I) using a dry grinder such as hammer mill, roll mill, ball mill and jet mill, mixing these materials using a mixer such as a ribbon blender, V-shape blender or Henshell mixer, or mixing these raw materials, and then grinding the mixture using a dry grinder; or a wet method which comprises adding these raw materials to a medium such as water, grinding and/or mixing these raw materials using a wet grinder such as medium-agitated grinder or grinding these raw materials using a dry grinder, adding the ground raw materials to a medium such as water to prepare a slurry, drying the slurry using a spray drier to prepare a ground mixture, and then subjecting the ground mixture thus obtained to heat treatment so that it is calcined.

In particular, referring to activator element source compounds, it is necessary that a small amount of these compounds be entirely uniformly mixed and dispersed, and it is thus preferred that a liquid medium be used, and preferred among the aforementioned grinding/mixing methods is wet method because other element source compounds can be also entirely uniformly mixed.

Further, during the preparation of the aforementioned ground mixture, additives for accelerating the crystal growth of the particulate phosphor during heat treatment (normally referred to as "flux") can be added. As the flux there can be used ammonium halide such as $NH_4Cl$ and $NH_4F \cdot HF$, alkaline carbonate such as $Na_2CO_3$ and $Li_2CO_3$, alkali halide such as LiCl, NaCl and KCl, halide of alkaline earth metal such as $CaCl_2$, $CaF_2$ and $BaF_2$, borate compound such as $B_2O_3$, $H_3BO_3$ and $NaB_4O_7$, phosphate such as $Li_3PO_4$ and $NH_4H_2PO_4$ or the like. Particularly preferred among these fluxes are $CaF_2$ and $H_3BO_3$.

The heat treatment is carried out by heating in a heat resistant vessel such as crucible and tray made of alumina, quartz, silicon carbide and platinum normally at a temperature of from 1,200° C. to 1,800° C. in the air or in gases such as oxygen, carbon monoxide, carbon dioxide, nitrogen, hydrogen and argon, singly or in admixture, for 10 minutes to 24 hours. As the heat resistant vessel there is preferably used a vessel made of alumina having a high purity or platinum, more preferably platinum, because such vessels have a low reactivity with the mixture of raw materials, and a phosphor having a high purity and a high luminescence can be obtained. Further, a vessel made of metal such as molybdenum and tungsten or a vessel made of boron nitride or the like can be used. The calcining temperature is normally from 1,200° C. to 1,800° C. When the calcining temperature is lower than 1,200° C., the solid state reaction of raw materials in the mixture proceeds insufficiently, making it unlikely that the target phosphor can be synthesized. On the other hand, when the calcining temperature is higher than 1,800° C., an expensive calcining furnace is needed and it is likely that unnecessary calcination energy can be consumed. Therefore, the calcining temperature is preferably from 1,400° C. to 1,700° C., more preferably from 1,500° C. to 1,650° C. As the calcining atmosphere there is normally employed air or gases such as oxygen, carbon monoxide, carbon dioxide, nitrogen, hydrogen and argon, singly or in admixture, but a reducing atmosphere is desirable to activate $Ce^{3+}$ ion in the host crystal stably and enhance luminescence, and in particular, a nitrogen atmosphere containing hydrogen is more desirable because body color of the host crystal assumes a clear green color to provide a remarkably enhanced luminescence. Further, when the material which has once been calcined in an oxidizing atmosphere or neutral atmosphere is again subjected to heat treatment in a reducing atmosphere, it is also effective for the stabilization of trivalent Ce, which is an activator element, in the host crystal as luminescence center ion. Further, the heating in a reducing atmosphere by a plurality of times, too, is effective for the enhancement of luminescence properties. The material thus heat-treated is subjected to washing, drying, classification, etc. as necessary. When the phosphor is washed with an acid, impurity phases other than host crystal such as flux attached to the surface of the phosphor can be removed to improve the luminescence to advantage. Further, as surface treatment, a ultrafine particulate material such as silica, alumina and calcium phosphate can be attached to the surface of the phosphor to improve the powder properties (agglomeration, dispersibility and precipitation behavior in solution, etc.). Referring to treatment after heat treatment, any techniques which are publicly known concerning known phosphors, e.g., those for use in cathode ray tube, plasma display panel, fluorescent lamp, fluorescent display tube, X-ray-intensifying screen, etc., are available, and it can be properly selected depending on the purpose, usage, etc.

As $M^1$ source compound, $M^2$ source compound and $M^3$ source compound there may be exemplified oxides, hydroxides, carbonates, nitrates, sulfates, oxalates, carboxylates, halides, etc. of $M^1$, $M^2$ and $M^3$, and they are selected from these examples taking into account their reactivity to composite oxide, whether or not NOx, SOx, etc. can be produced during calcination, etc.

Specific examples of Ce source compounds concerning Ce contained in the activator element $M^1$ include $Ce_2O_3$, $CeO_2$, $Ce(OH)_3$, $Ce(OH)_4$, $Ce_2(CO_3)_3$, $Ce(NO_3)_3$, $Ce_2(SO_4)_3$, $Ce(SO_4)_2$, $Ce_2(OCO)_6$, $Ce(OCOCH_3)_3$, $CeCl_3$, $CeCl_4$, etc.

Specifically exemplifying $M^2$ source compounds concerning the aforementioned Mg, Ca and Sr, which are desirable as divalent metal element $M^2$, examples of Mg source compounds include MgO, $Mg(OH)_2$, $MgCO_3$, $Mg(OH)_2 \cdot 3MgCO_3 \cdot 3H_2O$, $Mg(NO_3)_2 \cdot 6H_2O$, $MgSO_4$, $Mg(OCO)_2 \cdot 2H_2O$, $Mg(OCOCH_3)_2 \cdot 4H_2O$, $MgCl_2$, etc., examples of Ca source compounds include CaO, $Ca(OH)_2$, $CaCO_3$, $Ca(NO_3)_2 \cdot 4H_2O$, $CaSO_4 \cdot 2H_2O$, $Ca(OCO)_2 \cdot H_2O$, $Ca(OCOCH_3)_2 \cdot H_2O$, $CaCl_2$, etc., and examples of Sr source compounds include SrO, $Sr(OH)_2$, $SrCO_3$, $Sr(NO_3)_2$, $Sr(OCO)_2$, $Sr(OCOCH_3)_2$, $SrCl_2$, etc.

Further, specifically exemplifying $M^3$ source compounds concerning the aforementioned Sc, Lu, Y and Al, which are desirable as trivalent metal element $M^3$, examples of Sc source compounds include $Sc_2O_3$, $Sc(OH)_3$, $Sc_2(CO_3)_3$, $Sc(NO_3)_3$, $Sc_2(SO_4)_3$, $Sc_2(OCO)_6$, $Sc(OCOCH_3)_3$, $ScCl_3$, etc., examples of Lu source compounds include $Lu_2O_3$, $Lu_2(SO_4)_3$, $LuCl_3$, etc., examples of Y source compounds include $Y_2O_3$, $Y(OH)_3$, $Y_2(CO_3)_3$, $Y(NO_3)_3$, $Y_2(SO_4)_3$, $Y_2(OCO)_6$, $Y(OCOCH_3)_3$, $YCl_3$, etc., and examples of Al source compounds include $Al_2O_3$, $Al(OH)_3$, AlOOH, $Al(NO_3)_3 \cdot 9H_2O$, $Al_2(SO_4)_3$, $AlCl_3$, etc.

The particle diameter of the phosphor of the present invention produced by the aforementioned production method is normally from not smaller than 0.1 µm to not greater than 50 µm, but the lower limit of the particle diameter of the phosphor of the present invention is preferably 1 µm or more, more preferably 2 µm or more and the upper limit of the particle diameter of the phosphor of the present invention is preferably 30 µm or less, more preferably 15 µm or less.

By subjecting the phosphor to necessary classification or crushing such that the particle diameter falls within this range, a more desirable phosphor can be obtained. As the classification there may be used any means such as wet classification, e.g., levigation and air flow classification, e.g., cyclone and inertia classifier. Further, concerning the crushing, too, the process is not limited and ball mill treatment or the like may be used.

The aforementioned particle diameter of phosphor means the particle diameter measured by a laser diffraction particle diameter distribution measuring device such as Model LA-300 produced by HORIBA, Ltd.

The phosphor of the present invention can be synthesized also by a spray pyrolysis method. For example, firstly, compounds containing the constituent elements of the phosphor to be produced are dissolved in a solvent such as water to prepare a raw material solution. The solvent for the raw material solution is not limited so far as it is a liquid the viscosity of which is low enough to form a droplet at the subsequent procedure but is preferably water taking into account cost and safety of exhaust gas.

As the compounds containing the constituent elements of said phosphor there may be used any raw materials which can be dissolved in the solvent used and reacted to decompose to oxides when heated to high temperature.

In order to obtain good luminescence property, these raw material compounds and raw material solutions are preferably those having little impurity elements such as iron and nickel which act as killer center.

The raw material solution may comprise various additives incorporated therein besides the constituent elements of the phosphor. For example, alkaline metal salts, halides and borates of various metals, etc. can be expected to exert a fluxing effect of accelerating crystal growth and a polyacid such as citric acid, a polyol such as ethylene glycol, etc. have an effect on the uniform mixing of the raw material metals and control over the particulate form of the obtained phosphor, and these additives can be thus added.

The content ratio of the raw material metals in the raw material solution is preferably the composition ratio of the target phosphor.

There is a tendency that when the total concentration of the aforementioned constituent elements in the raw material solution is raised, the phosphor thus obtained has a raised secondary particle diameter, and on the contrary, when the total concentration of the aforementioned constituent elements in the raw material solution is reduced, the phosphor thus obtained has a reduced secondary particle diameter. Further, when the concentration of solute is too small, the amount of the solvent to be evaporated rises, requiring unnecessary energy to disadvantage. On the other hand, when the concentration of solute is too great, it is made difficult to form a droplet. Accordingly, in order to synthesize a good phosphor, the total number of moles of the constituent elements of the phosphor contained in the raw material solution is preferably from not smaller than 0.01 mol/l to not greater than 10 mol/l.

Subsequently, droplets are formed from the raw material solution thus obtained. The formation of droplets can be carried out by various spray methods. For example, there may be employed a method which comprises spraying a liquid while being sucked up by compressed air to form droplets having a particle diameter of from 1 μm to 50 μm, a method which comprises utilizing an ultrasonic wave having a frequency of about 2 MHz from a piezoelectric crystal to form droplets having a particle diameter of from 4 μm to 10 μm, a method which comprises supplying a liquid at a predetermined speed into an orifice having a hole diameter of from 10 μm to 20 μm which is being oscillated by an oscillator so that the liquid is discharged from the hole of orifice in a predetermined amount at a time, depending on the frequency to form droplets having a particle diameter of from 5 μm to 50 μm, a method which comprises dropping a liquid at a predetermined rate onto a rotating disc so that droplets having a particle diameter of from 20 μm to 100 μm are formed from the liquid by centrifugal force, a method which comprises applying a high voltage to the surface of a liquid to form droplets having a particle diameter of from 0.5 μm to 10 μm, etc. For the production of a phosphor having a uniform particle diameter on the order of submicron to micron which can be used for cathode ray tube, fluorescent lamp, FED, etc., a spray method involving the utilization of ultrasonic wave that can form droplets having a particle diameter as relatively uniform as 4 μm to 10 μm is desirable.

The droplets thus formed can be converted into a particulate phosphor by heating such as introducing into a pyrolysis reaction furnace by a carrier gas. In this pyrolysis reaction furnace, factors affecting the heating speed such as kind of solution, kind of carrier gas, flow rate of carrier gas and temperature in the pyrolysis reaction furnace cause the production of particles having various forms such as hollow particle, porous particle, solid particle and crushed particle and various surface conditions.

As the carrier gas there can be used hydrogen, nitrogen, argon, oxygen, air or the like, or a mixture thereof, but in order to obtain good luminescence properties, nitrogen, argon, a mixture of nitrogen and hydrogen, or a mixture of argon and hydrogen is desirable, and nitrogen or a mixture of nitrogen and hydrogen is more desirable from the standpoint of cost. The mixing ratio of hydrogen in the mixture of hydrogen and nitrogen or argon is preferably 10% or less, more preferably 5% or less, particularly preferably not greater than 4%, which is the lower limit of explosibility of hydrogen gas, from the standpoint of safety. On the other hand, the mixing ratio of hydrogen is preferably high, more preferably 1% or more, even more preferably 2% or more from the standpoint of enhancement of reducing ability.

The heating temperature is normally predetermined such that the lower limit is 1,200° C. or more and the upper limit is 1,900° C. When this pyrolysis reaction temperature is too low, the crystallinity is of the host crystal in the obtained phosphor low and the activator elements such as Ce cannot be effectively dispersed in the crystal, giving a tendency toward lower luminescence property. On the other hand, when the pyrolysis reaction temperature is too high, it not only causes the consumption of unnecessary energy but also the evaporation of constituent components of phosphor and the sudden condensation of constituent components of phosphor during cooling, making it easy to deteriorate luminescence property. From this standpoint of view, the lower limit and upper limit of heating temperature are preferably 1,500° C. or more and 1,700° C. or less, respectively.

The pyrolysis reaction is normally carried out for a reaction time of from not shorter than 0.1 seconds to not longer than 10 minutes, i.e., residence time in the pyrolysis reaction furnace. Among these reaction time periods, the reaction time period of from not shorter than 1 second to not longer than 1 minute is preferably used to carry out the reaction. When the reaction time is too short, the phosphor thus obtained has a low crystallinity and the activator elements such as Ce cannot be activated in the crystal, giving a tendency toward lower luminescence property. On the other hand, it goes without saying that when the reaction time is too long, it merely causes the consumption of unnecessary energy but the drop of productivity, giving a tendency that an unexpected reaction such as decomposition of phosphor occurs to cause easily the drop of brightness.

While the method for synthesis of the phosphor of the present invention has been described with reference to solid state reaction method and spray pyrolysis method, the synthesis method is not limited thereto, and ordinary methods known as method for synthesis of inorganic compound powder can be used. For example, the phosphor of the present invention can be produced by preparing a precursor material comprising raw materials uniformly mixed therein by a sol-gel method, a complex polymerization method, a uniform precipitation method or the like, and then subjecting the precursor material to heat treatment. The heat treatment method in this case can be carried out by a method which is almost the same as the heat treatment method in the aforementioned solid state reaction method, but a precursor having metals in raw materials uniformly mixed therein can be used to synthesize a phosphor having excellent properties at a lower temperature than in the case of solid phase reaction method.

The light emitting device of the present invention has the aforementioned phosphor as a wavelength conversion material and a semiconductor light emitting device such as LED and LD. It is a high color rendering light emitting device, which contains phosphors and which absorb light in the wavelength range of from ultraviolet to visible light emitted by the semiconductor light emitting device to emit visible light in a longer wavelength range and thus can be suitably used as a light source for display such as color liquid crystal display comprising back light unit and lighting system such as surface emitting. The light emitting device may contain other phosphors besides the phosphor of the present invention. Further, impurity compounds produced with the production of the phosphor of the present invention may be incorporated to an extent such that the properties cannot be impaired.

Figure 3:
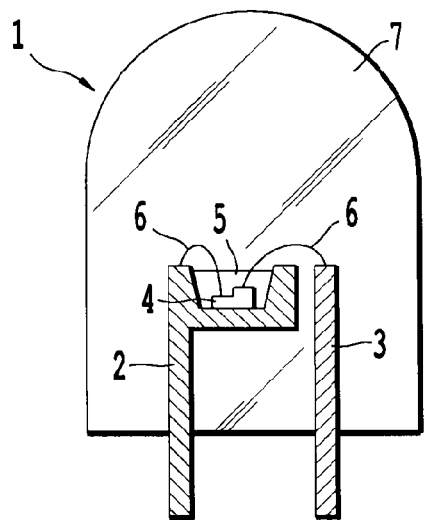
FIG. 3 is a diagrammatic sectional view illustrating an example of a light emitting device having a phosphor of the present invention as a wavelength conversion material and a semiconductor light emitting device.

The light emitting device of the present invention will be hereinafter described in connection with the drawings. FIG. 3 is a diagrammatic sectional view illustrating an example of a light emitting device having a phosphor of the present invention as a wavelength conversion material and a semiconductor light emitting device, FIG. 4 is a diagrammatic sectional view illustrating an example of a surface emitting lighting system having the light emitting device shown in FIG. 3 incorporated therein, and in FIGS. 3 and 4, the numeral 1 indicates a light emitting device, the numeral 2 indicates a mount lead, the numeral 3 indicates an inner lead, the numeral 4 indicates a semiconductor light emitting device, the numeral 5 indicates a phosphor-containing resin portion, the numeral 6 indicates an electrically-conductive wire, the numeral 7 indicates a molding member, the numeral 8 indicates a surface emitting lighting system, the numeral 9 indicates a diffusion plate, and the numeral 10 indicates a retaining case.

The light emitting device 1 of the present invention, as shown in FIG. 3, is in an ordinary shell-type form and has a semiconductor light emitting device 4 made of a GaN-based blue light-emitting diode or the like provided in the upper cap of the mount lead 2, and the semiconductor light emitting device 4 is covered and fixed at the upper part thereof by a phosphor-containing resin portion 5 formed by mixing a wavelength conversion material containing at least a phosphor of the present invention with a binder such as epoxy resin and acrylic resin so that it is dispersed in the binder, and then pouring the dispersion into a cap. On the other hand, the semiconductor light emitting device 4 and the mount lead 2, and the semiconductor light emitting device 4 and the inner lead 3 are electrically connected to each other with the electrically-conductive wire 6, and they are entirely covered and protected by the molding member 7 made of epoxy resin or the like.

Figure 4:
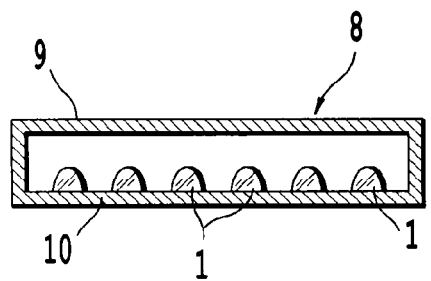
FIG. 4 is a diagrammatic sectional view illustrating an example of a planar light emitting lighting system having the light emitting device shown in FIG. 3 incorporated therein.

Further, the surface emitting lighting system 8 having this light emitting device 1 incorporated therein, as shown in FIG. 4, has a large number of light emitting devices 1 provided on the bottom surface of a rectangular retaining case 10, the inner surface of which is opaque such as white smooth, a power supply and a circuit (not shown) for driving the light emitting device 1 provided thereoutside and a diffusion plate such as semiopaque acryl sheet fixed at the position corresponding to the cover portion of the retaining case 10 for uniformalizing light emission.

When the surface emitting lighting system 8 is driven and a voltage is applied to the semiconductor light emitting device 4 of the light emitting device 1, blue light, etc. are emitted. These emissions are partly absorbed by the phosphor of the present invention which is a wavelength conversion material in the phosphor-containing resin portion 5 to emit light having a longer wavelength. On the other hand, the longer wavelength light is mixed with blue light, which have not been absorbed by the phosphor to obtain emission having high color rendering. This light passes through the diffusion plate 9 and is then emitted upward as viewed on FIG. 4 to obtain lighting having in-plain uniform brightness in the diffusion plate 9 of the retaining case 10.

Further, the phosphor obtained in the present invention can be used not only for the aforementioned light emitting device utilizing emission of semiconductor light emitting device but also as green wavelength conversion material for use in full-color inorganic electroluminescence device as proposed in "Proceedings of The 10th International Display Workshops", pp. 1109-1112 (2003). In other words, for example, the full-color electroluminescence light emitting device of the present invention has a blue light-emitting electroluminescence light emitting device, the aforementioned phosphor as a green wavelength conversion material and an arbitrary red wavelength conversion material and has minute blue, green and red light-emitting regions formed therein the emission intensity of which are electrically controlled to make full-color display. Further, the full-color electroluminescence light emitting device having the aforementioned constitution can be used as a surface emitting light emitting device showing emission of white color or specific color tone so that it can be used as a backlight unit for color liquid crystal display to constitute a display or surface emitting lighting system. The electroluminescence light emitting device may comprise other phosphors incorporated therein besides the phosphor of the present invention.

Further, the phosphor obtained in the present invention can emit light when irradiated with not only ultraviolet rays or visible light but also cathode ray, X-ray or the like or under electric field and thus can be used as a phosphor utilizing these excitating means.

Moreover, the phosphor of the present invention can be used also for a display having a light source (excitation source) and a phosphor. Examples of the display include vacuum fluorescent display (VFD), field emission display (FED), plasma display panel (PDP), cathode ray tube (CRT), etc. Further, the phosphor of the present invention can be used also for backlight for display.

EXAMPLE

The present invention will be further described hereinafter in the following examples, but the present invention is not limited thereto so far as the essence thereof is not exceeded. The measurement of emission spectrum, excitation spectrum and emission intensity in the following examples and comparative examples were effected at room temperature (25° C.).

Example 1

Raw material powders were measured out such that $CeO_2$ as $M^1$ source compound, $CaCO_3$ as $M^2$ source compound and $Sc_2O_2$ as $M^3$ source compound were incorporated in an amount of 0.01 mols, 0.99 mols and 1 mol, respectively, based on 1 mol of phosphor to give a phosphor chemical composition $Ce_{0.01}Ca_{0.99}Sc_2O_4$. These raw material powders were wet-ground and mixed with ethanol as a dispersion medium in a powder mixer, and the dispersion medium was then evaporated away to obtain a dried mixture of ground raw material powders. The dried ground mixture thus obtained was heated at 1,600° C. at maximum in a nitrogen atmosphere containing 40 of hydrogen in a platinum crucible for 3 hours so that it was calcined, and then subsequently subjected to washing with water, grinding, drying and classification to produce a phosphor powder.

Figure 2:
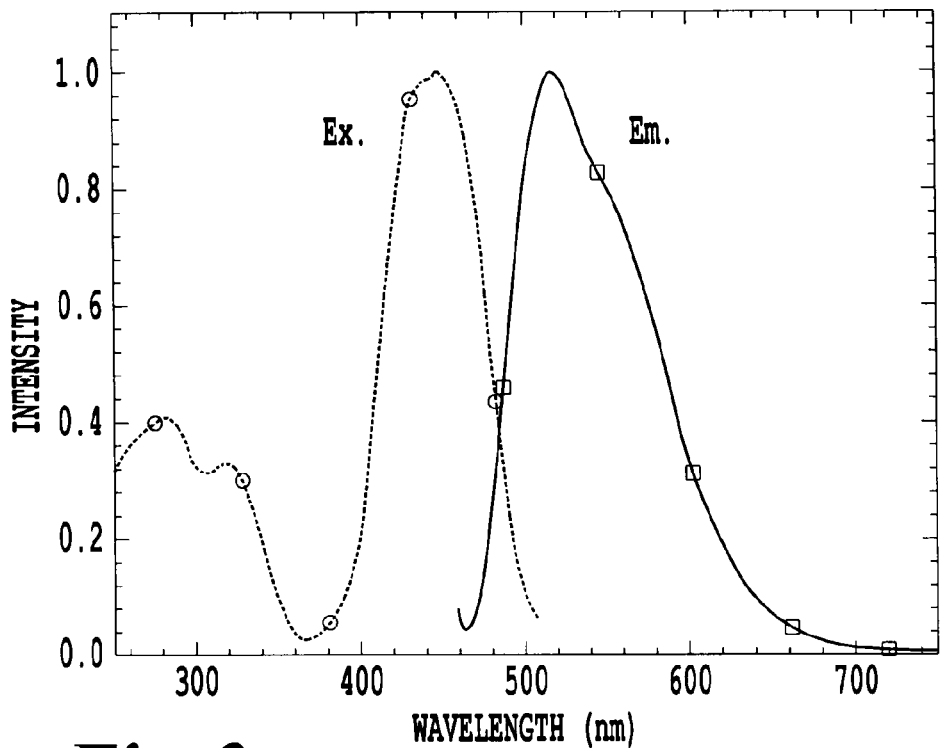
FIG. 2 is a diagram illustrating the emission spectrum (solid line) and the excitation spectrum (dotted line) of the phosphor obtained in Example 1 of the present invention.

The median diameter of the thus obtained phosphor measured by a Type LA-300 laser diffraction particle size distribution meter (produced by HORIBA, Ltd.) was 14 μm. The observation under scanning electron microscope showed that this phosphor was an agglomeration of primary particles having a diameter of about 3 μm. Further, the powder X-ray diffraction pattern of this phosphor was as shown in FIG. 1 and coincided with the diffraction pattern set forth in JCPDS card No. 72-1360, demonstrating that this phosphor is a compound having a crystal structure having the same space group Pnma as $CaSc_2O_4$. Moreover, when this phosphor was measured for emission spectrum and excitation spectrum using a Type F-4500 fluorescence spectrophotometer (produced by HITACHI, LTD.), the spectrum shown in FIG. 2 was obtained, demonstrating that this phosphor comprises trivalent Ce incorporated in the aforementioned host crystal. Further, it was confirmed that this phosphor shows an emission peak wavelength of 516 nm and hence little variation of excitation intensity in a blue wavelength range of from 450 nm to 465 nm and thus is efficiently excited to emit green light when irradiated with light from a blue LED which emits light in this wavelength range. Supposing that the emission intensity of the phosphor of Comparative Example 1 is 100, the emission intensity of this phosphor at the emission peak wavelength developed when this phosphor is irradiated with excitation light having a wavelength of 455 nm was 143, demonstrating that this phosphor shows a remarkably high emission intensity as compared with the conventional yellow phosphors.

When this phosphor was irradiated with blue light from a GaN-based blue light-emitting diode (peak wavelength: 460 nm) to adjust its irradiance, this phosphor absorbed the blue light to emit green light which was then mixed with the blue light from the diode which had not been absorbed by the phosphor to show emission of bluish green light.

Further, this green phosphor and an Eu-activated CaS red phosphor were mixed with an epoxy resin, spread over an InGaN-based blue light-emitting diode (peak wavelength: 460 nm), heat-cured, and then sealed in a transparent epoxy resin to prepare a shell-type white LED. When this LED was electrically energized, it showed a high luminous intensity and an average color rendering index of 90 to great advantage. The Eu-activated CaS red phosphor was obtained by mixing CaS and $EuF_3$ at a molar ratio of 99.6:0.4, heating the mixture at 1,000° C. in an alumina crucible in a nitrogen atmosphere containing 4% of hydrogen for two hours, and then subjecting the material to grinding and classification.

Comparative Example 1

1.05 mols of $Y_2O_3$, 0.39 mols of $Gd_2O_3$, 2.5 mols of $Al_2O_3$, 0.12 mols of $CeO_2$, 0.25 mols of $BaF_2$ as a flux were ground and mixed with purified water in a wet ball mill comprising an alumina vessel with beads, dried, and then passed through a nylon mesh. The ground mixture thus obtained was then heated to 1,450° C. in the air in an alumina crucible for two hours so that it was calcined. Subsequently, the material was washed with water, ground, dried, and then classified to obtain a $(Y_{0.7}Gd_{0.26}Ce_{0.04})_3Al_5O_{12}$ phosphor. The emission intensity of the phosphors of Examples 1 to 14 were compared with that of this phosphor at an excitation wavelength of 455 nm as 100. When this phosphor was irradiated with emission of the aforementioned blue light-emitting diode, the emission of this phosphor and the blue light from the diode which had not been absorbed by this phosphor were mixed to give light that looked white.

Examples 2 to 6

Phosphors were produced in the same manner as in Example 1 except that the material of the crucible and the calcining temperature during the production of the phosphor were changed as set forth in Table 1.

The phosphors thus obtained were each identified comprising $CaSc_2O_4$ as a host crystal and having trivalent Ce as an activator element in said host crystal by the analysis of powder X-ray diffraction, emission spectrum, and excitation spectrum. The emission peak wavelength and the emission intensity of the phosphors thus obtained are also set forth in Table 1. For the measurement of the emission spectrum of the phosphors of Example 2 and after, a high speed phosphor evaluation device produced by JASCO Corporation was used. This device comprises a Xe lamp as a light source and a Type C7041 multi-channel detector produced by Hamamatsu Photonics K.K. as a light detector.

The phosphors produced using a platinum crucible showed a high emission intensity, and the phosphors obtained by calcining at 1,600° C. within this temperature range showed the highest emission intensity.

Examples 7 to 11

Phosphors were produced in the same manner as in Example 1 except that the formulation of mixing of raw materials Ce and Ca of phosphor were changed as set forth in Table 2. The phosphors thus obtained were each identified comprising $CaSc_2O_4$ as a host crystal and having trivalent Ce as an activator element in said host crystal by the analysis of powder X-ray diffraction, emission spectrum, and excitation spectrum. The emission peak wavelength and the emission intensity of the phosphors thus obtained are also set forth in Table 2. The phosphors obtained by adjusting the Ce mixing molar ratio to 0.01 showed the highest emission intensity. Further, as the concentration of Ce increased, the emission peak wavelength shifted toward a longer wavelength and a higher color purity green emission was shown.

Examples 12 to 14

Phosphors were produced in the same manner as in Example 1 except that the formulation of raw material mixing was changed as set forth in Table 3 such that some of Ca atoms in the phosphor were replaced by Mg. However, $MgCO_3$ was used as a Mg element source in addition to the raw materials described in Example 1. When identified by powder X-ray diffraction, the phosphors thus obtained had the same space group as in Example 1 but showed reduced lattice constants and further had a small amount of MgO incorporated therein. Further, when measured for emission spectrum, the phosphors showed an emission peak wavelength shifted toward a longer wavelength. These facts showed that some of Mg atoms in the raw material had been solid-dissolved in the host crystal. The emission peak wavelength and the emission intensity of the phosphors thus obtained are set forth in Table 3. The replacement of Ca by Mg caused the drop of emission intensity, but the emission peak wavelength shifted toward a longer wavelength to cause desirable emission of green light.

Example 15

An aqueous solution of cerium nitrate, an aqueous solution of calcium nitrate and an aqueous solution of scandium nitrate were mixed such that the metal element ratio (molar ratio) of the raw material solution were Ce:Ca:Sc=0.01:0.99:2, and then thoroughly stirred. This mixed aqueous solution was dried in a platinum vessel, and then heated to 1,400° C. at highest in a nitrogen atmosphere containing 4% of hydrogen for 3 hours so that it was calcined to produce a phosphor.

The phosphor thus obtained was identified to be a compound having a crystal structure having the same space group Pnma as $CaSc_2O_4$ by the analysis using powder X-ray diffraction. Further, when measured for emission spectrum and excitation spectrum using a fluorescence spectrophotometer, this phosphor was identified having trivalent Ce incorporated in the aforementioned host crystal as an activator element. Further, this phosphor showed an emission peak wavelength of 513 nm and little variation of excitation intensity in a blue wavelength range of from 450 nm to 465 nm and thus was confirmed to be efficiently excited by light from a blue LED which emits in this wavelength range to emit green light. The emission intensity at the emission peak wavelength when this phosphor was irradiated with an excitation light having a wavelength of 455 nm was defined to be 100.

Example 16

A phosphor as produced in the same manner as in Example 15 except that an aqueous solution of manganese nitrate, an aqueous solution of cerium nitrate, an aqueous solution of calcium nitrate and an aqueous solution of scandium nitrate were used in such an arrangement that the metal element ratio of the raw material solution was molar ratio values set forth in Table 4.

The emission peak wavelength of the phosphor thus obtained when irradiated with an excitation light having a wavelength of 455 nm and the emission intensity at the wavelength are set forth in Table 4. However, this emission intensity is represented relative to the emission intensity of the phosphor of Example 15 thus obtained at the emission peak wavelength when irradiated with an excitation light having a wavelength of 455 nm as 100.

As set forth in Table 4, the coactivation by Mn caused the rise of the emission intensity of the phosphor.

Examples 17 to 30

A phosphor as produced in the same manner as in Example 15 except that an aqueous solution of nitrate of rare earth element as coactivator, an aqueous solution of cerium nitrate, an aqueous solution of calcium nitrate and an aqueous solution of scandium nitrate were used in such an arrangement that the metal element ratio of the raw material solution was molar ratio values set forth in Table 4.

The emission peak wavelength of the phosphor thus obtained when irradiated with an excitation light having a wavelength of 455 nm and the emission intensity at the wavelength are set forth in Table 4. However, this emission intensity is represented relative to the emission intensity of the phosphor of Example 15 thus obtained at the emission peak wavelength when irradiated with an excitation light having a wavelength of 455 nm as 100.

As set forth in Table 4, the coactivation by Pr, Tb, Dy or Tm caused the rise of the emission intensity of the phosphor. In particular, in the case where Pr was incorporated, emission derived from Pr appeared with emission from Ce. Further, even when Nd, Sm, Ho, Er and Yb were incorporated in a slight amount, no remarkable drop of emission intensity was recognized.

Examples 31 to 44

A phosphor was produced in the same manner as in Example 15 except that nitrate of Mg, nitrate of Sr and nitrate of Ba were incorporated in addition to the nitrates used in Example 15 such that the metal element ratio in the raw material solution was as set forth in Table 5 to prepare an aqueous solution of a mixture of nitrates.

The emission peak wavelength of the phosphor thus obtained when irradiated with an excitation light having a wavelength of 455 nm and the emission intensity at the wavelength are set forth in Table 5. However, this emission intensity is represented relative to the emission intensity of the phosphor of Example 15 thus obtained at the emission peak wavelength when irradiated with an excitation light having a wavelength of 455 nm as 100.

As set forth in Table 5, when the content of Ca was decreased and the content of Mg or Sr were increased, the phosphors having a small content of Mg or Sr showed an increase of emission intensity, and these phosphors showed a gradual drop of emission intensity with the rise of Mg content or Sr content. Further, when the content of Sr was increased, the emission peak wavelength shifted toward a shorter wavelength to increase the emission of bluish green light. On the other hand, when the content of Ba was increased, the emission intensity was monotonously decreased, but even when the molar ratio of Ba was increased to 0.4, the emission intensity was kept at about 30 or more.

Examples 45 to 55

A phosphor was produced in the same manner as in Example 15 except that nitrate of Al, nitrate of Y and nitrate of Lu were incorporated in addition to the nitrates used in Example 15 such that the metal element ratio in the raw material solution was as set forth in Table 6 to prepare an aqueous solution of a mixture of nitrates.

The emission peak wavelength of the phosphor thus obtained when irradiated with an excitation light having a wavelength of 455 nm and the emission intensity at the wavelength are set forth in Table 6. However, this emission intensity is represented relative to the emission intensity of the phosphor of Example 15 thus obtained at the emission peak wavelength when irradiated with an excitation light having a wavelength of 455 nm as 100.

As set forth in Table 6, when the content of Sc was decreased and the content of Al, Y or Lu were increased, the phosphors having a small content of Al, Y or Lu showed an increase of emission intensity, and these phosphors showed a drop of emission intensity with the rise of Al content or Y content.

A tendency was shown that the emission peak wavelength shifts toward a shorter wavelength with the rise of Al content. On the other hand, the emission peak wavelength shifted toward a longer wavelength with the rise of Y content or Lu content.

Examples 56 to 63

A phosphor was produced in the same manner as in Example 15 except that nitrate of Mg, nitrate of Sr, nitrate of Ba and nitrate of Al were incorporated in addition to the nitrates used in Example 15 such that the metal element ratio in the raw material solution was as set forth in Table 7 to prepare an aqueous solution of a mixture of nitrates.

The emission peak wavelength of the phosphor thus obtained when irradiated with an excitation light having a wavelength of 455 nm and the emission intensity at the wavelength are set forth in Table 7. However, this emission intensity is represented relative to the emission intensity of the phosphor of Example 15 thus obtained at the emission peak wavelength when irradiated with an excitation light having a wavelength of 455 nm as 100.

Examples 64 to 69

A phosphor was produced in the same manner as in Example 15 except that nitrate of Mg, nitrate of Sr, nitrate of Ba and nitrate of Y were incorporated in addition to the nitrates used in Example 15 such that the metal element ratio in the raw material solution was as set forth in Table 8 to prepare an aqueous solution of a mixture of nitrates.

The emission peak wavelength of the phosphor thus obtained when irradiated with an excitation light having a wavelength of 455 nm and the emission intensity at the wavelength are set forth in Table 8. However, this emission intensity is represented relative to the emission intensity of the phosphor of Example 15 thus obtained at the emission peak wavelength when irradiated with an excitation light having a wavelength of 455 nm as 100.

Examples 70 to 86

A phosphor was produced in the same manner as in Example 15 except that nitrate of Mg, nitrate of Sr, nitrate of Ba and nitrate of Lu were incorporated in addition to the nitrates used in Example 15 such that the metal element ratio in the raw material solution was as set forth in Table 9 to prepare an aqueous solution of a mixture of nitrates.

The emission peak wavelength of the phosphor thus obtained when irradiated with an excitation light having a wavelength of 455 nm and the emission intensity at the wavelength are set forth in Table 9. However, this emission intensity is represented relative to the emission intensity of the phosphor of Example 15 thus obtained at the emission peak wavelength when irradiated with an excitation light having a wavelength of 455 nm as 100.

Example 87

A precursor solution containing metal salts, respectively, in the following concentrations was prepared.
Ca(NO$_3$)$_2$ 0.0495 mol/L
Sc(NO$_3$)$_3$ 0.1 mol/L
Ce(NO$_3$)$_3$ 0.0005 mol/L This solution was put in an ultrasonic nebulizer equipped with a 1.7 MHz oscillator to form minute droplets. The flow of a nitrogen gas containing 4% of hydrogen caused these droplets to pass the interior of the core tube of a longitudinal cylindrical electric furnace. The electric furnace had a uniform temperature region length of about 150 cm and the temperature of the electrical furnace was set to 1,500° C. The gas flow rate was set to 2 L/min. When passed through the electric furnace, the droplets were dried to form a powder which was then recovered by an electric dust collector. The powder was a CaSc$_2$O$_4$:Ce phosphor produced by the reaction of the nitrate compounds contained in the precursor solution. The phosphor thus obtained absorbed blue light to show green light with good property. The luminescence properties are set forth in Table 10. The emission intensity set forth in Table 10 is a value relative to the emission intensity of the phosphor of Comparative Example 1 as 100. When particle diameter of the phosphor thus obtained was measured in the same manner as in Example 1, the median particle diameter (D$_{50}$) was found to be 1.0 µm, demonstrating that the phosphor was a phosphor having a sharp particle diameter distribution.

Example 88

A phosphor was synthesized by a spray pyrolysis method in the same manner as in Example 87 except that the flowing gas was nitrogen gas. The phosphor thus obtained was put in a crucible wherein it was then heated (annealed) to 1,500° C. in a nitrogen atmosphere containing 4% of hydrogen. The phosphor thus obtained absorbed blue light to show good emission of green light. The luminescence properties are set forth in Table 10.

Examples 89 to 91

The procedure of Example 88 was followed except that the annealing temperature was changed as set forth in Table 10 to obtain a phosphor. The luminescence properties of this phosphor are set forth in Table 10.

Examples 92, 93

Raw material compounds and a flux compound were fairly mixed such that the formulation of Table 11 was attained, and then subjected to heat treatment in the same manner as in Example 1 to obtain a phosphor. However, the calcining temperature was 1,550° C. The molar ratio of flux was the number of mols of the flux compound based on mol of phosphor CaSc$_2$O$_4$ to be produced. The phosphor thus obtained was soaked around-the-clock in a 1 normal hydrochloric acid to remove impurities such as excess flux. Thereafter, an operation of solid-solution separation, addition of water and agitation was repeated until the pH value of the supernatant liquid reached 4 or more. The phosphor thus washed was dried in a 120° C. drier, and then sieved so that the dried agglomerated material was loosened. The luminescence properties of the phosphor thus obtained are set forth in Table 11. The emission intensity was represented relative to that of the phosphor of Comparative Example 1 as 100.

Comparative Example 2

0.0297 mols of SrCO$_3$, 0.03 mols of Y$_2$O$_3$ and 0.0003 mols of CeO$_2$ were thoroughly wet-mixed with ethanol in a mortar, and then dried. This mixture was put on a platinum foil which was then heated to 1,450° C. in a nitrogen atmosphere containing 4% of hydrogen for two hours so that it was calcined to obtain SrY$_2$O$_4$:Ce. It was confirmed by powder X-ray diffraction that the material thus obtained has a crystal structure reported as SrY$_2$O$_4$. The material thus obtained was an orange color powder. The material thus obtained was irradiated with excitation light having a wavelength of 254 nm, 365 nm and 460 nm but showed no emission with light having any wavelength.

TABLE 1

| Example | Molar mixing ratio of raw material | | | Crucible material | Calcining temperature °C. | Emission intensity | Emission peak wavelength nm |
| --- | --- | --- | --- | --- | --- | --- | --- |
| | CeO$_2$ | CaCO$_3$ | Sc$_2$O$_3$ | | | | |
| Example 1 | 0.01 | 0.99 | 1 | Platinum | 1,600 | 143 | 516 |
| Example 2 | 0.01 | 0.99 | 1 | Alumina | 1,600 | 134 | 516 |
| Example 3 | 0.01 | 0.99 | 1 | Platinum | 1,500 | 133 | 516 |
| Example 4 | 0.01 | 0.99 | 1 | Alumina | 1,500 | 130 | 516 |
| Example 5 | 0.01 | 0.99 | 1 | Platinum | 1,400 | 114 | 514 |
| Example 6 | 0.01 | 0.99 | 1 | Alumina | 1,400 | 111 | 514 |

TABLE 2

| Example | Molar mixing ratio of raw material | | | Crucible material | Calcining temperature °C. | Emission intensity | Emission peak wavelength nm |
| --- | --- | --- | --- | --- | --- | --- | --- |
| | CeO$_2$ | CaCO$_3$ | Sc$_2$O$_3$ | | | | |
| Example 7 | 0.0005 | 0.9995 | 1 | Platinum | 1,600 | 62 | 512 |
| Example 8 | 0.001 | 0.999 | 1 | Platinum | 1,600 | 80 | 512 |
| Example 9 | 0.003 | 0.997 | 1 | Platinum | 1,600 | 111 | 513 |
| Example 1 | 0.01 | 0.99 | 1 | Platinum | 1,600 | 143 | 516 |
| Example 10 | 0.03 | 0.97 | 1 | Platinum | 1,600 | 103 | 521 |
| Example 11 | 0.05 | 0.95 | 1 | Platinum | 1,600 | 79 | 527 |

TABLE 3

| Example | Molar mixing ratio of raw material | | | | Crucible material | Calcining temperature °C. | Emission intensity | Emission peak wavelength nm |
| --- | --- | --- | --- | --- | --- | --- | --- | --- |
| | CeO$_2$ | CaCO$_3$ | MgCO$_3$ | Sc$_2$O$_3$ | | | | |
| Example 1 | 0.01 | 0.99 | | 1 | Platinum | 1,600 | 143 | 516 |
| Example 12 | 0.01 | 0.693 | 0.297 | 1 | Platinum | 1,600 | 98 | 520 |
| Example 13 | 0.01 | 0.495 | 0.495 | 1 | Platinum | 1,600 | 92 | 523 |
| Example 14 | 0.01 | 0.297 | 0.693 | 1 | Platinum | 1,600 | 69 | 524 |

TABLE 4

| Example | Coactivator | | Molar ratio of element | | | Emission intensity | Emission peak wavelength nm |
| --- | --- | --- | --- | --- | --- | --- | --- |
| | Kind of element | Molar ratio | Ce | Ca | Sc | | |
| Example 15 | | | 0.01 | 0.99 | 2 | 100 | 513 |
| Example 16 | Mn | 0.003 | 0.01 | 0.987 | 2 | 126 | 514 |
| Example 15 | | | 0.01 | 0.99 | 2 | 100 | 513 |
| Example 17 | Pr | 0.003 | 0.01 | 0.987 | 2 | 111 | 513 |
| Example 15 | | | 0.01 | 0.99 | 2 | 100 | 513 |
| Example 18 | Nd | 0.003 | 0.01 | 0.987 | 2 | 97 | 513 |
| Example 15 | | | 0.01 | 0.99 | 2 | 100 | 513 |
| Example 19 | Sm | 0.003 | 0.003 | 0.994 | 2 | 91 | 512 |
| Example 15 | | | 0.01 | 0.99 | 2 | 100 | 513 |
| Example 20 | Tb | 0.003 | 0.003 | 0.994 | 2 | 122 | 514 |
| Example 21 | Tb | 0.01 | 0.003 | 0.987 | 2 | 133 | 514 |
| Example 22 | Tb | 0.003 | 0.01 | 0.987 | 2 | 117 | 515 |
| Example 23 | Tb | 0.01 | 0.01 | 0.98 | 2 | 106 | 514 |
| Example 15 | | | 0.01 | 0.99 | 2 | 100 | 513 |
| Example 24 | Dy | 0.003 | 0.01 | 0.987 | 2 | 121 | 514 |
| Example 25 | Dy | 0.01 | 0.01 | 0.98 | 2 | 103 | 514 |
| Example 15 | | | 0.01 | 0.99 | 2 | 100 | 513 |
| Example 26 | Ho | 0.003 | 0.003 | 0.994 | 2 | 88 | 513 |
| Example 15 | | | 0.01 | 0.99 | 2 | 100 | 513 |
| Example 27 | Er | 0.003 | 0.01 | 0.987 | 2 | 88 | 514 |
| Example 15 | | | 0.01 | 0.99 | 2 | 100 | 513 |
| Example 28 | Tm | 0.003 | 0.01 | 0.987 | 2 | 125 | 513 |
| Example 29 | Tm | 0.01 | 0.01 | 0.98 | 2 | 89 | 514 |
| Example 15 | | | 0.01 | 0.99 | 2 | 100 | 513 |
| Example 30 | Yb | 0.01 | 0.01 | 0.98 | 2 | 84 | 514 |

TABLE 5

| Example | M$^2$ element other than Ca | | Molar ratio of element | | | Emission intensity | Emission peak wavelength nm |
| --- | --- | --- | --- | --- | --- | --- | --- |
| | Kind of element | Molar ratio | Ce | Ca | Sc | | |
| Example 15 | | | 0.01 | 0.99 | 2 | 100 | 513 |
| Example 31 | Mg | 0.10 | 0.01 | 0.89 | 2 | 125 | 514 |
| Example 32 | Mg | 0.20 | 0.01 | 0.79 | 2 | 97 | 515 |

TABLE 5-continued

| Example | M² element other than Ca Kind of element | M² element other than Ca Molar ratio | Molar ratio of element Ce | Molar ratio of element Ca | Molar ratio of element Sc | Emission intensity | Emission peak wavelength nm |
|---|---|---|---|---|---|---|---|
| Example 33 | Mg | 0.40 | 0.01 | 0.59 | 2 | 58 | 514 |
| Example 15 |    |      | 0.01 | 0.99 | 2 | 100 | 513 |
| Example 34 | Sr | 0.10 | 0.01 | 0.89 | 2 | 156 | 509 |
| Example 35 | Sr | 0.20 | 0.01 | 0.79 | 2 | 139 | 509 |
| Example 36 | Sr | 0.30 | 0.01 | 0.69 | 2 | 123 | 507 |
| Example 37 | Sr | 0.40 | 0.01 | 0.59 | 2 | 123 | 503 |
| Example 38 | Sr | 0.60 | 0.01 | 0.39 | 2 | 127 | 499 |
| Example 39 | Sr | 0.70 | 0.01 | 0.29 | 2 | 97 | 497 |
| Example 40 | Sr | 0.90 | 0.01 | 0.09 | 2 | 99 | 491 |
| Example 41 | Sr | 0.99 | 0.01 |      | 2 | 79 | 485 |
| Example 15 |    |      | 0.01 | 0.99 | 2 | 100 | 513 |
| Example 42 | Ba | 0.20 | 0.01 | 0.79 | 2 | 56 | 515 |
| Example 43 | Ba | 0.30 | 0.01 | 0.69 | 2 | 42 | 513 |
| Example 44 | Ba | 0.40 | 0.01 | 0.59 | 2 | 33 | 510 |

TABLE 6

| Example | M³ element other than Sc Kind of element | M³ element other than Sc Molar ratio | Molar ratio of element Ce | Molar ratio of element Ca | Molar ratio of element Sc | Emission intensity | Emission peak wavelength nm |
|---|---|---|---|---|---|---|---|
| Example 15 |    |     | 0.01 | 0.99 | 2.0 | 100 | 513 |
| Example 45 | Al | 0.4 | 0.01 | 0.99 | 1.6 | 109 | 515 |
| Example 46 | Al | 0.6 | 0.01 | 0.99 | 1.4 | 91 | 513 |
| Example 47 | Al | 0.8 | 0.01 | 0.99 | 1.2 | 41 | 509 |
| Example 15 |    |     | 0.01 | 0.99 | 2.0 | 100 | 513 |
| Example 48 | Y  | 0.2 | 0.01 | 0.99 | 1.8 | 109 | 515 |
| Example 49 | Y  | 0.8 | 0.01 | 0.99 | 1.2 | 69 | 546 |
| Example 15 |    |     | 0.01 | 0.99 | 2.0 | 100 | 513 |
| Example 50 | Lu | 0.6 | 0.01 | 0.99 | 1.4 | 102 | 512 |
| Example 51 | Lu | 0.8 | 0.01 | 0.99 | 1.2 | 88 | 513 |
| Example 52 | Lu | 1.0 | 0.01 | 0.99 | 1.0 | 60 | 518 |
| Example 53 | Lu | 1.2 | 0.01 | 0.99 | 0.8 | 45 | 519 |
| Example 54 | Lu | 1.4 | 0.01 | 0.99 | 0.6 | 41 | 522 |
| Example 55 | Lu | 1.6 | 0.01 | 0.99 | 0.4 | 28 | 520 |

TABLE 7

| Example | M² element other than Ca Kind of element | M² element other than Ca Molar ratio | M³ element other than Sc Kind of element | M³ element other than Sc Molar ratio | Molar ratio of element Ce | Molar ratio of element Ca | Molar ratio of element Sc | Emission intensity | Emission peak wavelength nm |
|---|---|---|---|---|---|---|---|---|---|
| Example 15 |    |     |    |     | 0.01 | 0.99 | 2   | 100 | 513 |
| Example 56 | Mg | 0.3 | Al | 0.6 | 0.01 | 0.69 | 1.4 | 58 | 514 |
| Example 15 |    |     |    |     | 0.01 | 0.99 | 2   | 100 | 513 |
| Example 57 | Sr | 0.1 | Al | 0.2 | 0.01 | 0.89 | 1.8 | 77 | 512 |
| Example 58 | Sr | 0.1 | Al | 0.6 | 0.01 | 0.89 | 1.4 | 52 | 512 |
| Example 59 | Sr | 0.3 | Al | 0.2 | 0.01 | 0.69 | 1.8 | 79 | 511 |
| Example 60 | Sr | 0.3 | Al | 0.6 | 0.01 | 0.69 | 1.4 | 71 | 513 |
| Example 61 | Sr | 0.5 | Al | 0.6 | 0.01 | 0.49 | 1.4 | 55 | 507 |
| Example 15 |    |     |    |     | 0.01 | 0.99 | 2   | 100 | 513 |
| Example 62 | Ba | 0.1 | Al | 0.2 | 0.01 | 0.89 | 1.8 | 69 | 514 |
| Example 63 | Ba | 0.1 | Al | 0.6 | 0.01 | 0.89 | 1.4 | 67 | 513 |

TABLE 8

| | M² element other than Ca | | M³ element other than Sc | | Molar ratio of element | | | Emission intensity | Emission peak wavelength nm |
|---|---|---|---|---|---|---|---|---|---|
| Example | Kind of element | Molar ratio | Kind of element | Molar ratio | Ce | Ca | Sc | | |
| Example 15 | | | | | 0.01 | 0.99 | 2 | 100 | 513 |
| Example 64 | Mg | 0.3 | Y | 0.2 | 0.01 | 0.69 | 1.8 | 49 | 529 |
| Example 15 | | | | | 0.01 | 0.99 | 2 | 100 | 513 |
| Example 65 | Sr | 0.1 | Y | 0.2 | 0.01 | 0.89 | 1.8 | 77 | 513 |
| Example 66 | Sr | 0.3 | Y | 0.2 | 0.01 | 0.69 | 1.8 | 79 | 502 |
| Example 67 | Sr | 0.3 | Y | 0.6 | 0.01 | 0.69 | 1.4 | 56 | 517 |
| Example 68 | Sr | 0.5 | Y | 0.2 | 0.01 | 0.49 | 1.8 | 70 | 497 |
| Example 15 | | | | | 0.01 | 0.99 | 2 | 100 | 513 |
| Example 69 | Ba | 0.1 | Y | 0.2 | 0.01 | 0.89 | 1.8 | 67 | 519 |

TABLE 9

| | M² element other than Ca | | M³ element other than Sc | | Molar ratio of element | | | Emission intensity | Emission peak wavelength nm |
|---|---|---|---|---|---|---|---|---|---|
| Example | Kind of element | Molar ratio | Kind of element | Molar ratio | Ce | Ca | Sc | | |
| Example 15 | | | | | 0.01 | 0.99 | 2 | 100 | 513 |
| Example 70 | Mg | 0.1 | Lu | 0.2 | 0.01 | 0.89 | 1.8 | 83 | 519 |
| Example 71 | Mg | 0.1 | Lu | 0.6 | 0.01 | 0.89 | 1.4 | 53 | 513 |
| Example 72 | Mg | 0.1 | Lu | 1.0 | 0.01 | 0.89 | 1.0 | 68 | 516 |
| Example 73 | Mg | 0.3 | Lu | 0.2 | 0.01 | 0.69 | 1.8 | 99 | 522 |
| Example 74 | Mg | 0.3 | Lu | 0.6 | 0.01 | 0.69 | 1.4 | 72 | 520 |
| Example 75 | Mg | 0.3 | Lu | 1.0 | 0.01 | 0.69 | 1.0 | 81 | 524 |
| Example 76 | Mg | 0.5 | Lu | 0.2 | 0.01 | 0.49 | 1.8 | 60 | 523 |
| Example 15 | | | | | 0.01 | 0.99 | 2 | 100 | 513 |
| Example 77 | Sr | 0.1 | Lu | 0.6 | 0.01 | 0.89 | 1.4 | 55 | 507 |
| Example 78 | Sr | 0.1 | Lu | 1.0 | 0.01 | 0.89 | 1.0 | 52 | 507 |
| Example 79 | Sr | 0.3 | Lu | 0.2 | 0.01 | 0.69 | 1.8 | 85 | 502 |
| Example 80 | Sr | 0.3 | Lu | 0.6 | 0.01 | 0.69 | 1.4 | 118 | 501 |
| Example 81 | Sr | 0.3 | Lu | 1.0 | 0.01 | 0.69 | 1.0 | 101 | 495 |
| Example 82 | Sr | 0.5 | Lu | 0.2 | 0.01 | 0.49 | 1.8 | 82 | 494 |
| Example 83 | Sr | 0.5 | Lu | 0.6 | 0.01 | 0.49 | 1.4 | 114 | 489 |
| Example 84 | Sr | 0.5 | Lu | 1.0 | 0.01 | 0.49 | 1.0 | 121 | 486 |
| Example 15 | | | | | 0.01 | 0.99 | 2 | 100 | 513 |
| Example 85 | Ba | 0.1 | Lu | 0.6 | 0.01 | 0.89 | 1.4 | 89 | 512 |
| Example 86 | Ba | 0.1 | Lu | 1.0 | 0.01 | 0.89 | 1.0 | 72 | 514 |

TABLE 10

| Example | Molar ratio of element | | | Atmospheric gas for spray pyrolysis | Spray temp. | Annealing temp. | Emission intensity | Emission peak wavelength nm |
|---|---|---|---|---|---|---|---|---|
| | Ce | Ca | Sc | | | | | |
| Example 87 | 0.01 | 0.99 | 2 | Nitrogen + 4% hydrogen | 1,500 | | 52 | 514 |
| Example 88 | 0.01 | 0.99 | 2 | Nitrogen | 1,500 | 1,500 | 118 | 518 |
| Example 89 | 0.01 | 0.99 | 2 | Nitrogen | 1,500 | 1,300 | 91 | 516 |
| Example 90 | 0.01 | 0.99 | 2 | Nitrogen | 1,500 | 1,200 | 53 | 512 |
| Example 91 | 0.01 | 0.99 | 2 | Nitrogen | 1,500 | 1,100 | 42 | 514 |

TABLE 11

| Example | Molar ratio of element | | | Kind of flux | Molar ratio of flux | Calcining temp. °C | Emission intensity | Emission peak wavelength nm |
|---|---|---|---|---|---|---|---|---|
| | Ce | Ca | Sc | | | | | |
| Example 92 | 0.01 | 0.99 | 2 | CaF$_2$ | 0.03 | 1,550 | 148 | 517 |
| Example 93 | 0.01 | 0.99 | 2 | H$_3$BO$_3$ | 0.03 | 1,550 | 149 | 515 |

While the present invention has been described in detail and with reference to specific embodiments thereof, it will be apparent to one skilled in the art that various changes and modifications can be made therein without departing from the spirit and scope thereof.

The present invention is based on Japanese Patent Application (Japanese Patent Application 2004-194508) filed on Jun. 30, 2004 and the contents thereof are hereby incorporated therein by reference.

INDUSTRIAL APPLICABILITY

In accordance with the present invention, a phosphor which can be easily produced and can provide a light emitting device having a high color rendering, a light emitting device comprising the phosphor, and a display and a lighting system comprising the light emitting device as a light source can be provided.

The invention claimed is:

1. A light emitting device comprising:
a phosphor which is a wavelength conversion material, and
a semiconductor light emitting device which emits light in a wavelength range of from ultraviolet to visible light,
wherein the phosphor comprises a phosphor represented by the formula (I) and comprises a composite oxide comprising divalent and trivalent metal elements, as a host crystal, and at least Ce as an activator element in said host crystal, wherein the phosphor has a maximum emission peak in a wavelength range of from 485 nm to 555 nm in the emission spectrum at room temperature:

$$M^1_a M^2_b M^3_c O_d \quad (I),$$

wherein $M^1$ represents an activator element containing at least Ce; $M^2$ represents a divalent metal element; $M^3$ represents a trivalent metal element comprising at least Sc in an amount of 50% or more of the trivalent metal element $M^3$; a is a number within a range of $0.0001 \leq a \leq 0.2$; b is a number within a range of $0.8 \leq b \leq 1.2$; c is a number within a range of $1.6 \leq c \leq 2.4$; and d is a number within a range of $3.2 \leq d \leq 4.8$.

2. The light emitting device according to claim 1, wherein the divalent metal element of $M^2$ comprises at least one of Mg, Ca, and Sr.

3. The light emitting device according to claim 1, wherein a is a number within a range of $0.002 \leq a \leq 0.04$.

4. The light emitting device according to claim 1, wherein 50 mol % or more of the divalent metal element $M^2$ is Ca.

5. The light emitting device according to claim 3, wherein 50 mol % or more of the divalent metal element $M^2$ is Ca.

6. The light emitting device according to claim 1, wherein a is a number within a range of $0.003 \leq a \leq 0.03$, b is a number within a range of $0.97 \leq b \leq 0.997$, c is 2, and 50 mol % or more of the divalent metal element $M^2$ is Ca.

7. The light emitting device according to claim 1, wherein the maximum emission peak in a wavelength range of from 485 nm to 555 nm in the emission spectrum at room temperature is obtained by exciting with a blue LED having a wavelength of 420 nm to 485 nm.

8. The light emitting device according to claim 1, wherein said activator element $M^1$ in the formula (I) comprises at least Ce and at least one element selected from the group consisting of Cr, Mn, Fe, Co, Ni, Cu, Pr, Nd, Sm, Eu, Tb, Dy, Ho, Er, Tm and Yb.

9. The light emitting device according to claim 1, wherein said divalent metal element $M^2$ in general formula (I) is at least one metal element selected from the group consisting of Mg, Ca, Zn, Sr, Cd and Ba.

10. The light emitting device according to claim 1, wherein said trivalent metal element $M^3$ in the formula (I) includes Sc and at least one metal element selected from the group consisting of Al, Ga, Y, In, La, Gd, and Lu.

11. The light emitting device according to claim 1, wherein said host crystal of said phosphor is a crystal represented by the composition formula $M^2 M^3_2 O_4$, in which $M^2$ represents a divalent metal element and $M^3$ represents a trivalent metal element.

12. The light emitting device according to claim 1, wherein said host crystal of said phosphor has any of space groups Pnma, Fd3(-)m, $P2_1/n$, $P2_1$, $P6_3$ or $P2_1/c$.

13. The light emitting device according to claim 1, which has a maximum emission peak in a wavelength range of from 500 nm to 535 nm in the emission spectrum at room temperature.

14. A display comprising the light emitting device according to claim 1.

15. A lighting system comprising the light emitting device according to claim 1 as a light source.

16. An electroluminescence light emitting device comprising a phosphor which comprises a phosphor represented by the formula (I) and comprises a composite oxide comprising divalent and trivalent metal elements, as a host crystal, and at least Ce as an activator element in said host crystal, wherein said phosphor has a maximum emission peak in a wavelength range of from 485 nm to 555 nm in the emission spectrum at room temperature:

$$M^1_a M^2_b M^3_c O_d \quad (I),$$

wherein $M^1$ represents an activator element containing at least Ce; $M^2$ represents a divalent metal element; $M^3$ represents a trivalent metal element comprising at least Sc in an amount of 50% or more of the trivalent metal element $M^3$; a is a number within a range of $0.0001 \leq a \leq 0.2$; b is a number within a range of $0.8 \leq b \leq 1.2$; c is a number within a range of $1.6 \leq c \leq 2.4$; and d is a number within a range of $3.2 \leq d \leq 4.8$.

17. A display comprising the electroluminescence light emitting device according to claim 16 as a light source.

18. A lighting system comprising the electroluminescence light emitting device according to claim 16 as a light source.

* * * * *